United States Patent
Yoo et al.

(10) Patent No.: US 9,496,162 B2
(45) Date of Patent: Nov. 15, 2016

(54) METHOD FOR SUPPLYING INERT GAS TO STB IN SEMICONDUCTOR WAFER PRODUCTION SYSTEM AND SEMICONDUCTOR WAFER PRODUCTION SYSTEM USING THE SAME

(71) Applicant: Daifuku Co., Ltd., Osaka-shi (JP)

(72) Inventors: Dong Gyu Yoo, Asan-si (KR); Jae Hyun Lee, Asan-si (KR); Jun Han Lee, Asan-si (KR); Ui Han Jeong, Asan-si (KR)

(73) Assignee: Daifuku Co. Ltd., Osaka (JP)

( * ) Notice: Subject to any disclaimer, the term of this patent is extended or adjusted under 35 U.S.C. 154(b) by 0 days.

(21) Appl. No.: 14/395,956

(22) PCT Filed: Oct. 7, 2013

(86) PCT No.: PCT/KR2013/008929
§ 371 (c)(1),
(2) Date: Oct. 21, 2014

(87) PCT Pub. No.: WO2014/069807
PCT Pub. Date: May 8, 2014

(65) Prior Publication Data
US 2015/0303086 A1    Oct. 22, 2015

(30) Foreign Application Priority Data
Oct. 31, 2012    (KR) .................. 10-2012-0122136

(51) Int. Cl.
*F17D 1/00*    (2006.01)
*H01L 21/673*    (2006.01)

(52) U.S. Cl.
CPC .... *H01L 21/67389* (2013.01); *Y10T 137/0352* (2015.04); *Y10T 137/0396* (2015.04)

(58) Field of Classification Search
CPC .................... Y10T 137/0318; Y10T 37/0352; Y10T 37/0396
See application file for complete search history.

(56) References Cited

U.S. PATENT DOCUMENTS

| 5,308,989 A * | 5/1994 | Brubaker | H01J 37/18 250/441.11 |
| 7,828,504 B2 * | 11/2010 | Pharand | H01L 21/67201 414/217 |
| 2008/0240892 A1 | 10/2008 | Courtois et al. | |

(Continued)

FOREIGN PATENT DOCUMENTS

| JP | 2012-019046 | 1/2012 |
| KP | 10-2012-0105269 A | 9/2012 |
| KR | 20-0376772 B | 3/2005 |

OTHER PUBLICATIONS

Int'l. Search Report issued in int'l. App. No. PCT/KR2013/008929, mailed Nov. 19, 2013.

(Continued)

*Primary Examiner* — R. K. Arundale
(74) *Attorney, Agent, or Firm* — Greer Burns & Crain Ltd.

(57) ABSTRACT

A method for supplying inert gas to a side track buffer (STB) in a semiconductor wafer production system includes a step of sensing that a front opening unified POD (FOUP) is loading on the STB and generating a first input signal, and a step of opening a valve for inert gas and supplying nitrogen gas to the FOUP based on the first input signal, and to a semiconductor wafer production system using the method.

11 Claims, 3 Drawing Sheets

(56) References Cited

U.S. PATENT DOCUMENTS

| | | | | |
|---|---|---|---|---|
| 2010/0037959 | A1* | 2/2010 | Kamaishi | G01F 1/68 137/14 |
| 2011/0265831 | A1* | 11/2011 | Lee | H01J 37/3244 134/30 |
| 2012/0235793 | A1* | 9/2012 | Yi | H01L 21/67294 340/10.1 |
| 2013/0025786 | A1* | 1/2013 | Davidkovich | G05D 16/2046 156/345.26 |
| 2013/0152857 | A1* | 6/2013 | Wright | C23C 16/4482 118/715 |

OTHER PUBLICATIONS

Int'l. Preliminary Report on Patentability issued May 5, 2015.

* cited by examiner

METHOD FOR SUPPLYING INERT GAS TO STB IN SEMICONDUCTOR WAFER PRODUCTION SYSTEM AND SEMICONDUCTOR WAFER PRODUCTION SYSTEM USING THE SAME

This is a National Phase Application filed under 35 U.S.C. §371, of International Application No. PCT/KR2013/008929, filed Oct. 7, 2013.

TECHNICAL FIELD

The present invention relates to a method for supplying inert gas to an STB in a semiconductor wafer production system in which a wafer can be prevented from being contaminated from a source of contamination such as oxygen or dust during the process movement and the efficiency of a semiconductor production process can be improved in the semiconductor production process, and to a semiconductor wafer production system using the method.

BACKGROUND ART

When a wafer produced by a typical semiconductor production process is transported to a facility that performs the next process, the wafer is stored in a wafer carriage (front opening unified POD, hereafter referred to as "FOUP") and is transported to each process facility through a storage space known as Side Track Buffer (STB) during the transportation.

Since the STB is provided on a rail on the ceiling of the factory that guides the STB, the STB has advantages in that the space usability can be improved and the movement distance between the processes can be shortened.

On the other hand, in the semiconductor production process, yield is a very important factor for measuring the economic efficiency. Incidentally, the reason for a low yield in the semiconductor production process is because the wafer is exposed to oxygen or dust during the process movement, which results in the wafer to be placed in the environment of being contaminated.

Therefore, there has been an effort such that the wafer is not exposed to the contaminated environment throughout the semiconductor production process.

DISCLOSURE OF THE INVENTION

Problem that the Invention is to Solve

The present invention is to provide a method for supplying inert gas to an STB in a semiconductor wafer production system in which a wafer can be prevented from being contaminated by a source of contamination such as oxygen or dust during the process movement and the efficiency of a semiconductor production process can be improved in the semiconductor production process, and a semiconductor wafer production system using the method.

Means for Solving the Problem

In order to solve the problems described above, a method for supplying inert gas to an STB in a semiconductor wafer production system which is an embodiment of the present invention may include a step of sensing that a FOUP is loading on the STB and generating a first input signal, and a step of opening a valve for inert gas and supplying nitrogen gas to the FOUP based on the first input signal.

According to an aspect of the embodiment of the present invention, the inert gas may include nitrogen gas.

According to the aspect of the embodiment of the present invention, the method for supplying the inert gas to the STB in the semiconductor wafer production system may further include a step of measuring a pressure and an amount of flow of the inert gas in the FOUP and controlling the supply of the inert gas using the measured pressure and amount of flow of the inert gas.

According to the aspect of the embodiment of the present invention, the method for supplying the inert gas to the STB in the semiconductor wafer production system may further include a step of measuring an amount of the inert gas pulled into the FOUP and an amount of the inert gas pulled out from the FOUP and thereby controlling the supply of the inert gas.

According to the aspect of the embodiment of the present invention, the method for supplying the inert gas to the STB in the semiconductor wafer production system may further include a step of acquiring ID information of the FOUP when the FOUP is loading on the STB and generating a second input signal. The step of opening the valve for inert gas and supplying nitrogen gas to the FOUP based on the first input signal may include a step of supplying the nitrogen gas to the FOUP based on the first input signal and the second input signal.

According to the aspect of the embodiment of the present invention, the method for supplying the inert gas to the STB in the semiconductor wafer production system may further include a step of displaying a port-adding screen on the user input unit when another STB is physically mounted on the semiconductor wafer production system, a step of activating an input-output device of the port after a port is added by software using the port-adding screen; and a step of causing the added port to be activated if the added port is disposed on a port of the semiconductor wafer production system using the user input unit.

According to the aspect of the embodiment of the present invention, there is a plurality of STBs. The method for supplying the inert gas to the STB in the semiconductor wafer production system may further include a step of causing a port to be disabled and deactivating the input-output device thereof if a FOUP does not exist in one of the plurality of STBs, and a step of cutting off an input-output signal of the port and eliminating a signal cable of the port when the deactivated port is removed through a port-removing screen.

A semiconductor wafer production system which is another embodiment of the present invention may include an STB on which a FOUP is mounted on a FOUP port, and an inert gas supplying device that opens a valve for inert gas and supplies the inert gas to the STB based on a first input signal when the first input signal is received, which is generated when the FOUP is mounted on the STB.

According to an aspect of the embodiment of the present invention, the inert gas may include nitrogen gas.

According to the aspect of the embodiment of the present invention, the STB may include a gas pressure and flow sensor that measures a pressure and an amount of flow of the inert gas in the FOUP. The inert gas supplying device may include a valve for inert gas that is opened by the first input signal, a pump that applies the pressure with respect to the inert gas, and a control unit that controls the pump such that the supply of the inert gas is controlled, using pressure information of the inert gas generated by the gas pressure sensor.

According to the aspect of the embodiment of the present invention, the STB may include a pull-in gas sensor that measures an amount of the inert gas pulled in the FOUP, and a pull-out gas sensor that measures an amount of the inert gas pulled out from the FOUP. The inert gas supplying device may control the supply of the inert gas based on information acquired from the pull-in gas sensor and the pull-out gas sensor.

According to the aspect of the embodiment of the present invention, the STB may acquire ID information of the FOUP and cause a second input signal to be generated when the FOUP is loading, and the inert gas supplying device may supply the nitrogen gas to the FOUP based on the first input signal and the second input signal.

Advantage of the Invention

According to the embodiments of the present invention having a configuration described above, in a semiconductor wafer production system, since an appropriate amount of inert gas can be supplied to a FOUP mounted on an STB used during the process movement, it is possible to prevent the semiconductor wafer from being in contact with the source of contamination during the process movement and it is possible to improve the yield.

Furthermore, in the semiconductor wafer production system, when the STB is added, attached or detached, the STB can be added or removed by using software without stopping the operation of the entire system, and thus, it is possible to increase the productivity of the semiconductor wafer.

BEST MODE FOR CARRYING OUT THE INVENTION

Hereinafter, a method for supplying inert gas to an STB in a semiconductor wafer production system and a semiconductor wafer production system using the method according to the present invention will be described in detail with reference to the drawings. Suffixes "module" and "unit" used in a configuration component described hereinafter are assigned or used together in consideration of only the convenience in creating this specification, and the two suffixes themselves do not have any distinguished meanings or roles from each other.

Figure 1:
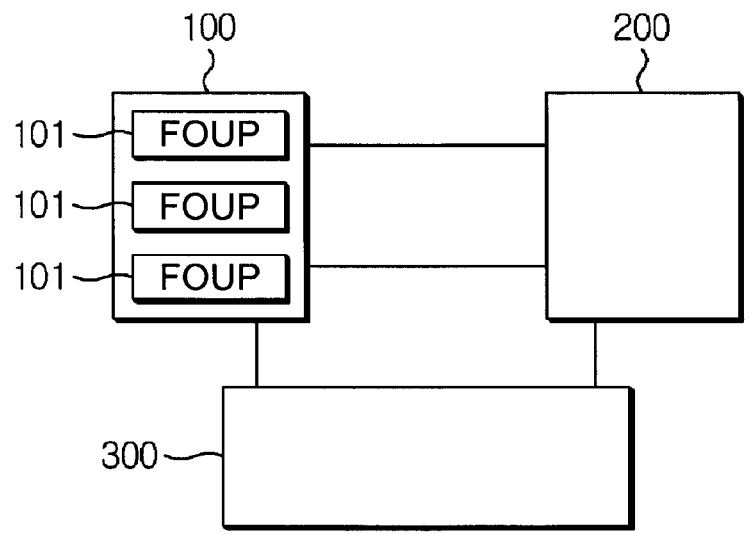
FIG. 1 is a block configuration diagram for explaining an overall configuration of the semiconductor wafer production system which is an embodiment of the present invention.

FIG. 1 is a block configuration diagram for explaining an overall configuration of the semiconductor wafer production system which is an embodiment of the present invention. As illustrated in FIG. 1, the semiconductor wafer production system which is an embodiment of the present invention may include an STB 100, an inert gas supplying device 200, and a main control device 300.

The STB 100 is a configuration component for causing a plurality of FOUPs 101 that accommodate a semiconductor wafer to move between the semiconductor production processes. At this time, an inert gas supplying tube is provided on the STB 100 and the inert gas is supplied into the FOUP 101. The description for this is illustrated in detail in FIG. 2.

The inert gas supplying device 200 is a configuration component for supplying the inert gas into the FOUP 101 which is installed on a FOUP port 110 installed on the STB 100. As the inert gas used here, nitrogen gas, argon gas, or the like may be used. This will be described in detail using FIG. 3.

The main control device 300 is a configuration component that controls the overall processes of the semiconductor wafer production system which is an embodiment of the present invention, and is a main controller that causes the FOUP 101 to be seated on the STB 100, checks the current state information of the inert gas supplying device 200 and the STB 100, and controls the above respectively.

Figure 2:
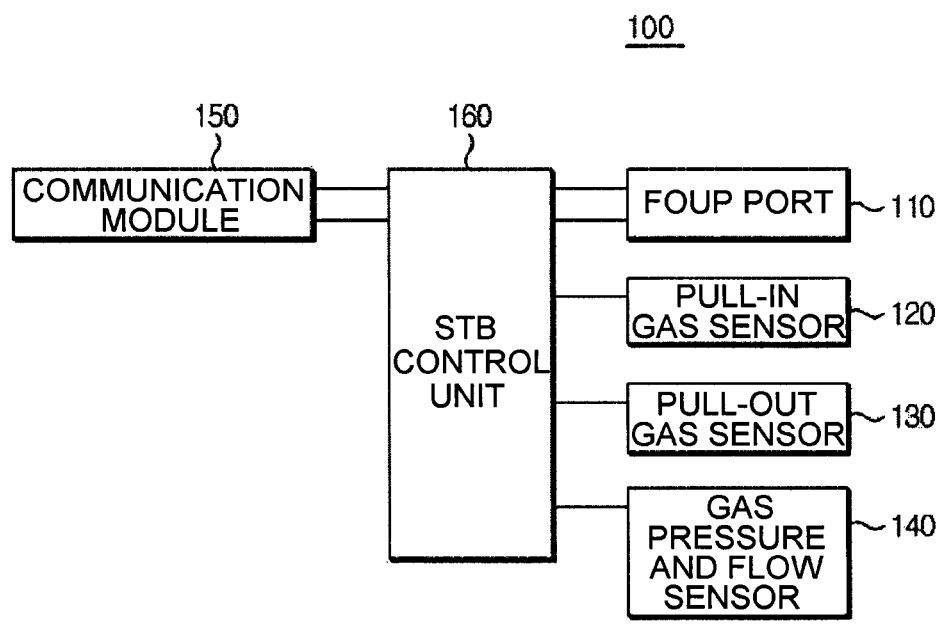
FIG. 2 is a block configuration diagram for explaining an electronic configuration of an STB used in the semiconductor wafer production system which is an embodiment of the present invention.

FIG. 2 is a block configuration diagram for explaining an electronic configuration of an STB used in the semiconductor wafer production system which is an embodiment of the present invention. As illustrated in FIG. 2, the STB 100 used in the semiconductor wafer production system which is an embodiment of the present invention includes the FOUP port 110, a pull-in gas sensor 120, a pull-out gas sensor 130, a gas pressure sensor 140 (or a gas flow sensor, or a combination thereof), a communication module 150, and an STB control unit 160.

The FOUP port 110 is a configuration component for causing the FOUP 101 to be seated on the STB 100. When the FOUP 101 is seated on the STB 100, a first input signal is generated and thereby the STB control unit 160 notifies the inert gas supplying device 200 of the seating via the communication module 150, and thus, the inert gas supplying device 200 supplies the inert gas into the FOUP 101 by causing a valve 210 to be open. On the other hand, when the FOUP 101 is seated on the FOUP port 110, ID information in the main control device 300 or in the FOUP 101 is acquired, and the appropriate inert gas is supplied into the FOUP 101.

The pull-in gas sensor 120 and the pull-out gas sensor 130 are configuration components for measuring amounts of the inert gas that is pulled into the FOUP 101 and the inert gas that is pulled out to the outside. By controlling the supply of the inert gas based on information acquired by the pull-in gas sensor and the pull-out gas sensor, the optimal inert gas is supplied into the FOUP 101.

The gas pressure sensor or the gas flow sensor 140 is a configuration component for measuring the internal pressure generated by the pull-in of the inert gas into the FOUP 101. The information acquired by the gas pressure sensor 140 is provided to the inert gas supplying device 200 via the communication module 150, and thereby a pump 220 operates, and thus, the optimal inert gas exists in the FOUP 101.

Hereinafter, an inert gas supplying device used in the semiconductor wafer production system which is an embodiment of the present invention will be described.

Figure 3:
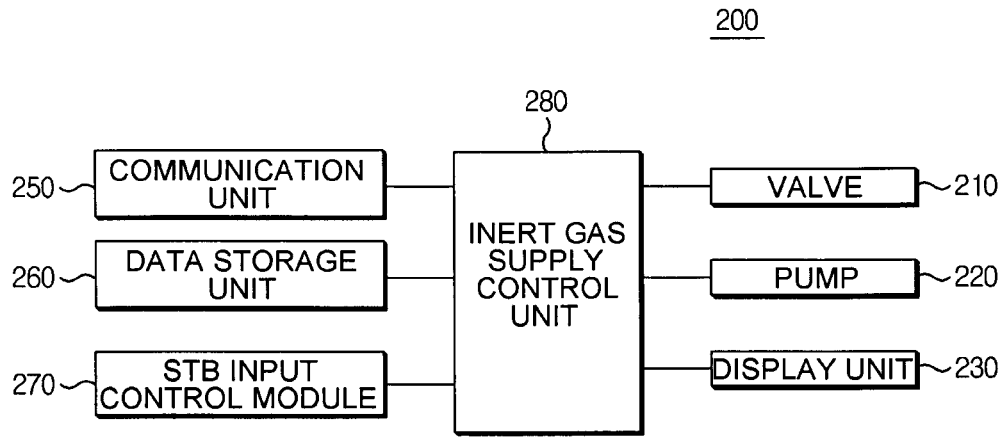
FIG. 3 is a block configuration diagram for explaining an electronic configuration of an inert gas supplying device used in the semiconductor wafer production system which is an embodiment of the present invention.

FIG. 3 is a block configuration diagram for explaining an electronic configuration of an inert gas supplying device used in the semiconductor wafer production system which is an embodiment of the present invention. As illustrated in FIG. 3, the inert gas supplying device 200 may include the valve 210, the pump 220, a display unit 230, an input unit 240, a communication unit 250, a data storage unit 260, an STB input control module 270, and an inert gas supply control unit 280.

The valve 210 is provided on the inert gas supplying tube installed on the STB 100, is opened based on the first input signal generated by the loading of the FOUP 101 on the STB 100, and then, performs a function of supplying the inert gas into the FOUP 101.

The pump 220 is a configuration component that provides the pressure needed for supplying the inert gas into the FOUP 101, and performs a function of controlling the amount of inert gas supplied to the FOUP 101, based on the ID signal of the FOUP 101 acquired by the loading of the FOUP 101 described above, information acquired from the pull-in gas sensor 120, the pull-out gas sensor 130, the gas pressure sensor 140, and the like.

The display unit 230 is a configuration component for visually displaying the operation state of the inert gas supplying device 200. In addition, the display unit 230 is a configuration component for illustrating a user interface (UI) which is used when the STB 100 is added or removed as described below. As the display unit, a touch screen may be used, and in this case, the display unit can be used as an input unit.

A user input unit 240 is a configuration component for inputting instructions for operation and control of the inert gas supplying device 200, and is a configuration component for inputting instruction words for adding or removing of the STB 100 described below.

The communication unit 250 is a configuration component for receiving various signals detected at the STB 100 described above.

The data storage unit 260 is a configuration component for storing error information, FOUP ID information, or the like.

The STB input control module 270 is a configuration component for activating or deactivating an STB input device, and is used when the STB 100 is added to or removed from the existing wafer production system, which will be described using FIG. 5 and FIG. 6.

The inert gas supply control unit 280 receives the pressure information of the FOUP 101 acquired via the communication unit 250, gas pull-in information, and gas pull-out information, causes the valve 210 and the pump 220 to operate based on the information items, and performs a function of supplying the appropriate inert gas to the FOUP 101.

Hereinafter, in the semiconductor wafer production system including the above-described configuration, a method for supplying the inert gas to the STB will be described in detail using FIG. 4.

Figure 4:
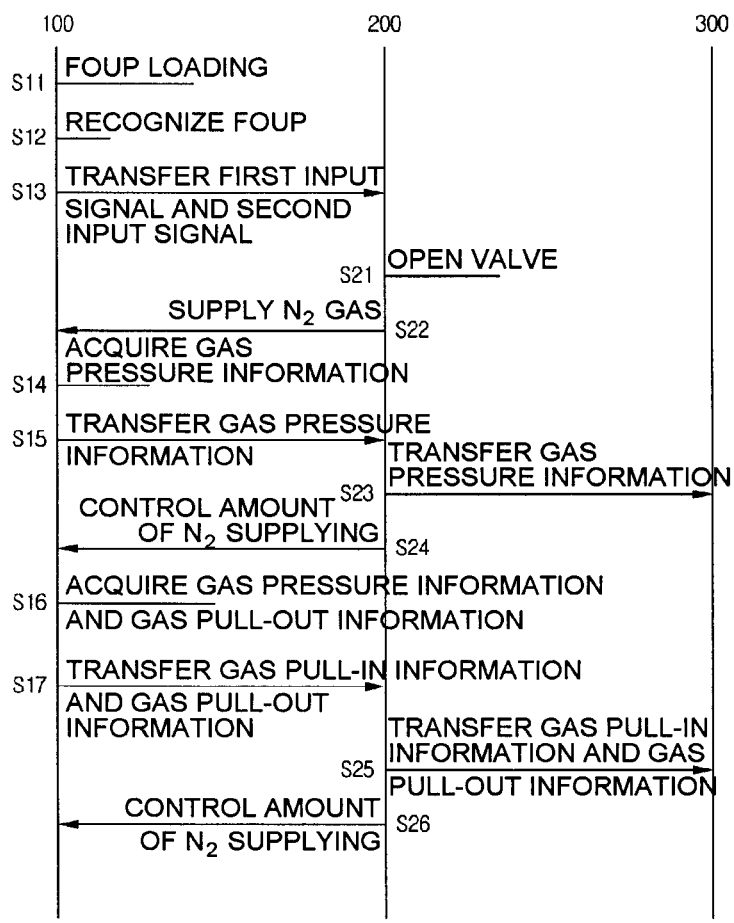
FIG. 4 is a flow chart for explaining a method for supplying inert gas to the STB in the semiconductor wafer production system which is an embodiment of the present invention.

FIG. 4 is a flow chart for explaining a method for supplying inert gas to the STB in the semiconductor wafer production system which is an embodiment of the present invention. As illustrated in FIG. 4, first, when the FOUP 101 is loading on the FOUP port 110 of the STB 100, the FOUP 101 is recognized and the FOUP ID information is acquired (S11 and S12). Next, when the first input signal due to the FOUP loading and the second input signal due to the FOUP ID information are transferred to the inert gas supplying device 200, the inert gas supplying device 200 opens the valve 210 (S13 and S21). As a result, nitrogen gas (inert gas) is supplied into the FOUP 101 (S22). When the nitrogen gas is supplied as above, the STB 100 acquires the pressure information of the gas in the FOUP 101 (S14), and the inert gas supplying device 200 which has received this pressure information controls the pump 220 and controls the amount of the inert gas pulled into the FOUP 101 (S15 and S24). Then, the information of the state in the FOUP 101 and the supply amount of the inert gas is provided to the main control device 300 (S23). In addition, when the gas pull-in information and the gas pull-out information in the FOUP 101 are acquired and transferred to the inert gas supplying device 200, the inert gas supplying device 200 controls the pump 220 using those information items, and controls the amount of inert gas pulled into the FOUP 101 (S16, S17, and S26). Then, the pull-in gas information and the pull-out gas information in the FOUP 101 are supplied to the main control device 300 (S25).

On the other hand, a method for adding the STB in the method for supplying the inert gas to the STB in the semiconductor wafer production system which is an embodiment of the present invention will be described with reference to FIG. 5.

Figure 5:
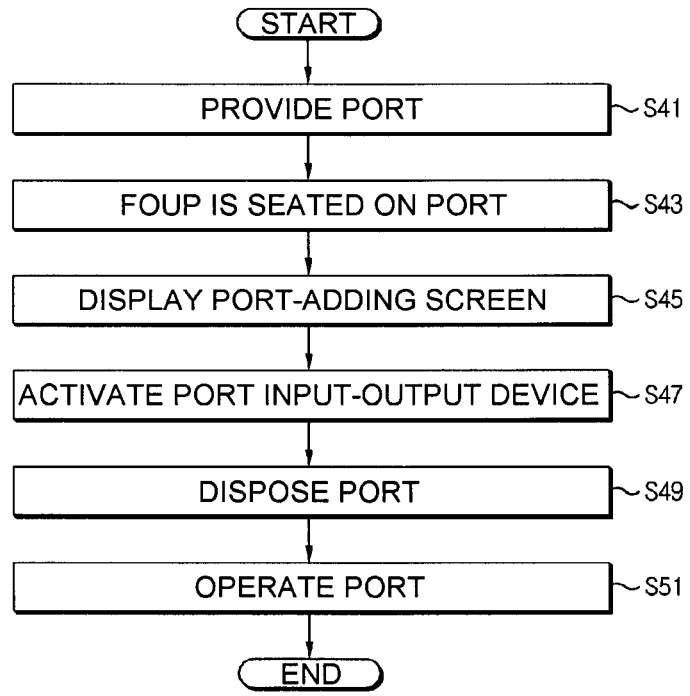
FIG. 5 is a flow chart for explaining a method for adding an STB in the method for supplying inert gas to the STB in the semiconductor wafer production system which is an embodiment of the present invention.

FIG. 5 is a flow chart explaining a method for adding the STB in the method for supplying the inert gas to the STB in the semiconductor wafer production system which is an embodiment of the present invention. As illustrated in FIG. 5, in a case where the STB 100 is added, an STB port is installed on the semiconductor wafer apparatus (S41). When the FOUP 101 is seated on the STB 100 which is installed on the STB port (S43), a port-adding screen is displayed on the display unit (S45). When the port is added through the port-adding screen, a port input device is activated, and subsequently, when the added port is disposed on a port of the semiconductor wafer production system using the user input unit, the added port is activated (S47, S49, and S51).

Hereinafter, a method for eliminating or removing the STB in the method for supplying the inert gas to the STB in the semiconductor wafer production system which is an embodiment of the present invention will be described with reference to FIG. 6.

Figure 6:
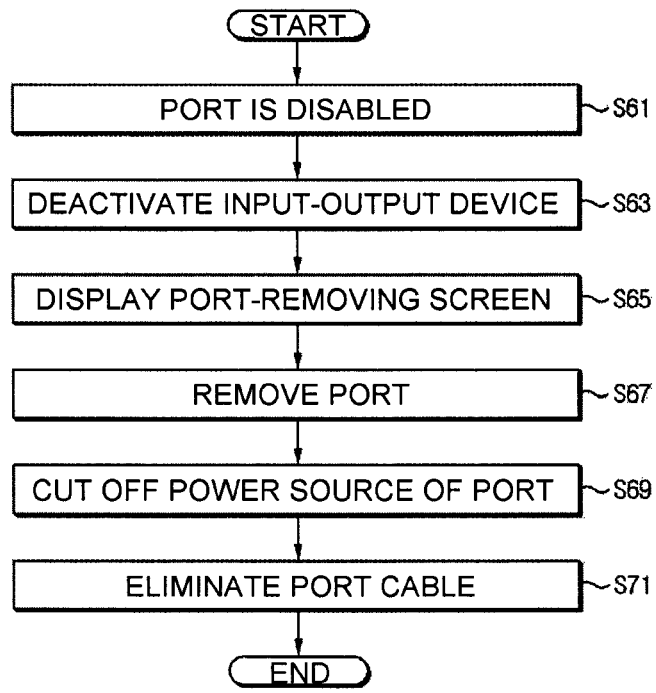
FIG. 6 is a flow chart for explaining a method for removing an STB in the method for supplying inert gas to the STB in the semiconductor wafer production system which is an embodiment of the present invention.

FIG. 6 is a flow chart for explaining a method for removing an STB in the method for supplying inert gas to the STB in the semiconductor wafer production system which is an embodiment of the present invention. As illustrated in FIG. 6, first, in a case where one STB 100 among the STBs already installed in the semiconductor wafer production system is eliminated, the STB port of the STB 100 to be eliminated is caused to be disabled (S61). As a result, the input-output device of the STB is deactivated and the port-removing screen is displayed on the display unit (S63 and S65). When the deactivated port is removed through the port-removing screen, the port signal is cut-off and then, a signal cable of the port can be eliminated (S67, S69, and S71).

According to an embodiment of the present invention having the above-described configuration, it is possible to supply an appropriate amount of inert gas into the FOUP mounted on the STB which is used at the time of process movement in the semiconductor wafer production system. Therefore, during the process movement, the semiconductor wafer can be prevented from being in contact with the source of contamination, and thus, it is possible to improve the yield.

Furthermore, in the semiconductor wafer production system, when the STB is added, attached or detached, the STB can be added or removed by software without stopping the operation of the entire system, and thus, it is possible to increase the productivity of the semiconductor wafer.

The method for supplying the inert gas to the STB in the semiconductor wafer production system and the semiconductor wafer production system using the method described above are not limited to the configuration and the method in the embodiment described above, and the embodiment described above may have a configuration in which all or a part of each embodiment is selectively combined such that various modifications can be made.

DESCRIPTION OF REFERENCE NUMERALS AND SIGNS

100: STB
200: inert gas supplying device
300: main control device
101: FOUP
110: FOUP port
120: pull-in gas sensor
130: pull-out gas sensor
140: gas pressure sensor
150: communication module
160: STB control unit
210: valve
220: pump
230: display unit (touch screen)
240: input unit
250: communication unit
260: data storage unit
270: STB input control module
280: inert gas supply control unit

What is claimed is:

1. A method for supplying inert gas to a side track buffer (STB) in a semiconductor wafer production system, the method comprising:
   a step of sensing that a front opening unified POD (FOUP) is loading on the STB and generating a first input signal;
   a step of opening a valve for inert gas and supplying nitrogen gas to the FOUP based on the first input signal,
   a step of displaying a port-adding screen on a user input unit when another STB is physically mounted on the semiconductor wafer production system;
   a step of activating an input-output device of a port after the port is added by software using the port-adding screen; and
   a step of causing the added port to be activated when the added port is disposed on a port of the semiconductor wafer production system using the user input unit.

2. The method for supplying inert gas to an STB in a semiconductor wafer production system according to claim 1,
   wherein the inert gas includes nitrogen gas.

3. The method for supplying inert gas to an STB in a semiconductor wafer production system according to claim 1, further comprising:
   a step of measuring a pressure and an amount of flow of the inert gas in the FOUP and controlling the supply of the inert gas using the measured pressure and amount of flow of the inert gas.

4. The method for supplying inert gas to an STB in a semiconductor wafer production system according to claim 1, further comprising:
   a step of measuring an amount of the inert gas pulled into the FOUP and an amount of the inert gas pulled out from the FOUP and thereby controlling the supply of the inert gas.

5. The method for supplying inert gas to an STB in a semiconductor wafer production system according to claim 1, further comprising:
   a step of acquiring ID information of the FOUP when the FOUP is loading on the STB and generating a second input signal,
   wherein, the step of opening the valve of the inert gas and supplying nitrogen gas to the FOUP based on the first input signal includes a step of controlling and supplying the nitrogen gas to the FOUP based on the first input signal and the second input signal.

6. The method for supplying inert gas to an STB in a semiconductor wafer production system according to claim 1,
   wherein there is a plurality of the STBs, and
   wherein the method further comprises:
   a step of causing a port to be disabled and deactivating the input-output device thereof if a FOUP does not exist in one of the plurality of STBs; and
   a step of cutting off an input-output signal of the port and eliminating a signal cable of the port when the deactivated port is removed through a port-removing screen.

7. A semiconductor wafer production system comprising:
   a side track buffer (STB) on which a front opening unified POD (FOUP) is mounted on a FOUP port;
   an inert gas supplying device that supplies inert gas to the STB based on a first input signal when the first input signal is received, which is generated if the FOUP is mounted on the STB,
   a pull-in gas sensor that measures an amount of the inert gas pulled in the FOUP; and
   a pull-out gas sensor that measures an amount of the inert gas pulled out from the FOUP,
   wherein an inert gas supplying device controls the supply of the inert gas based on information acquired from the pull-in gas sensor and the pull-out gas sensor.

8. The semiconductor wafer production system according to claim 7,
   wherein the inert gas includes nitrogen gas.

9. The semiconductor wafer production system according to claim 7,
   wherein the STB includes a gas pressure sensor that measures a pressure of the inert gas in the FOUP,
   wherein the inert gas supplying device includes:
   a valve for inert gas that is opened by the first input signal;
   a pump that applies the pressure with respect to the inert gas; and
   a control unit that controls the pump such that the supply of the inert gas is controlled, using pressure information of the inert gas generated by the gas pressure sensor.

10. The semiconductor wafer production system according to claim 7,
    wherein the STB acquires ID information of the FOUP and causes a second input signal to be generated when the FOUP is loading, and
    wherein the inert gas supplying device controls and supplies nitrogen gas to the FOUP based on the first input signal and the second input signal.

11. A method for supplying inert gas to a plurality of side track buffers (STB's) in a semiconductor wafer production system, the method comprising:

a step of sensing that a front opening unified POD (FOUP) is loading on the STB's and generating a first input signal;

a step of opening a valve for inert gas and supplying nitrogen gas to the FOUP based on the first input signal;

a step of causing a port to be disabled and deactivating an input-output device thereof if a FOUP does not exist in one of the plurality of STB's; and a step of cutting off an input-output signal of the port and eliminating a signal cable of the port when the deactivated port is removed through a port-removing screen.

* * * * *